(12) United States Patent
Choi et al.

(10) Patent No.: US 7,323,894 B2
(45) Date of Patent: Jan. 29, 2008

(54) NEEDLE ALIGNMENT VERIFICATION CIRCUIT AND METHOD FOR SEMICONDUCTOR DEVICE

(75) Inventors: Jong-Hyun Choi, Suwon-si (KR); Young-Hun Seo, Hwaseong-si (KR)

(73) Assignee: Samsung Electronics Co., Ltd., Suwon-si, Gyeonggi-do ( * ) Notice: Subject to any disclaimer, the term of this patent is extended or adjusted under 35 U.S.C. 154(b) by 134 days.

(21) Appl. No.: 11/360,827

(22) Filed: Feb. 23, 2006

(65) Prior Publication Data

US 2007/0030017 A1    Feb. 8, 2007

(30) Foreign Application Priority Data

Aug. 4, 2005    (KR) .................. 10-2005-0071345

(51) Int. Cl.
*G01R 31/02* (2006.01)
(52) U.S. Cl. .................. 324/761; 324/756; 324/758
(58) Field of Classification Search ............ None
See application file for complete search history.

(56) References Cited

FOREIGN PATENT DOCUMENTS

| | | |
|---|---|---|
| JP | 8037214 | 2/1996 |
| JP | 1082829 | 3/1998 |
| KR | 20050000010 | 1/2005 |

OTHER PUBLICATIONS

English Abstract.

*Primary Examiner*—Minh N. Tang
(74) *Attorney, Agent, or Firm*—F. Chau & Associates, LLC

(57) ABSTRACT

A needle alignment verification circuit includes a sensor pad, a first transmission line, a control element, a data pad, a second transmission line, and a response element. The sensor pad includes an insulation part and a conduction part. The first transmission line is electrically connected to the conduction part and to the interior of the semiconductor device. The control element asserts the first transmission line at a first logic state, and upon receiving the probe signal at the conduction part, transitions the logic state of the first transmission line to a second logic state. The second transmission line provides a predetermined signal to the data pad. The response element controls the second transmission line so that the second transmission line has the state of a verification result voltage for a misalignment state in response to the second logic state.

9 Claims, 5 Drawing Sheets

… … …
NEEDLE ALIGNMENT VERIFICATION CIRCUIT AND METHOD FOR SEMICONDUCTOR DEVICE

This application claims priority to Korean Patent Application No. 10-2005-71345, filed on Aug. 4, 2005, in the Korean Intellectual Property Office, the disclosure of which is incorporated by reference herein.

BACKGROUND OF THE INVENTION

1. Field of the Invention

The present invention relates to semiconductor devices and, more particularly, to a needle alignment verification circuit and method for verifying the alignment between a needle and a pad of a semiconductor device.

2. Description of Related Art

In general, semiconductor devices are manufactured on a semiconductor wafer in die form, separated from each other and packaged. Each of the semiconductor devices undergoes a variety of tests in the semiconductor wafer before being separated from each other. For such tests, needles for applying test voltages and/or signals need to be aligned with respective pads of each semiconductor device.

FIG. 1 is a diagram illustrating a method of verifying the alignment of needles within a semiconductor device. As illustrated in FIG. 1, a semiconductor device 30 includes a sensor pad 33. To test the alignment of needles, the sensor pad 33 is connected to the needle of a probe card 200. A tester 100 provides a probe signal to the sensor pad 33 through the needle of the probe card 20. When the alignment between the sensor pad 33 and the needle is abnormal, a circuit element (not shown) connected to the sensor pad 33 operates and generates a predetermined response signal. Accordingly, a measurer can be aware of the abnormal alignment that occurs while a test is performed.

As illustrated in FIG. 1, in a semiconductor device, a channel of the tester 100 is assigned for verifying the alignment of needles. Due to technological limitations, the number of channels of the tester 100 is limited. The assignment of the channel of the tester 100 to the verifying of the alignment of needles reduces the number of channels available for other uses. As a result, in the semiconductor device, a problem arises in that the overall test time increases due to a shortage of channels.

Therefore, a need exists for a needle alignment verifying circuit and method for verifying the alignment between needles and the pads of the semiconductor device.

SUMMARY OF THE INVENTION

A needle alignment verification circuit according to an embodiment of the present invention includes a sensor pad for receiving a probe signal provided through a voltage channel of a tester, the sensor pad including an insulation part made of insulating material and a conduction part made of conductive material and a first transmission line electrically connected to the conduction part of the sensor pad, and to an interior of the semiconductor device. The needle alignment verification circuit includes a control element for asserting the first transmission line at a first logic state, and upon receiving the probe signal at the conduction part, transitioning to a second logic state, a data pad, a second transmission line for providing a predetermined signal to the data pad, and a response element for controlling the second transmission line so that the second transmission line has the state of a verification result voltage for a misalignment state in response to the second logic state of the first transmission line.

A needle alignment verification method according to an embodiment of the present invention includes bringing a needle of a probe card into contact with a sensor pad, providing a probe signal from a tester to the sensor pad through the needle of the probe card, transmitting the probe signal, which is provided through the sensor pad, to a needle alignment verification unit, and detecting the state of a verification result voltage at a data pad, determining whether the state of the verification result voltage is the state of power voltage, and determining a misalignment of the needle and the sensor pad if the state of the proving result voltage is the state of the power voltage.

BRIEF DESCRIPTION OF THE DRAWINGS

Features of the present invention will be more clearly understood from the following detailed description taken in conjunction with the accompanying drawings, in which.

DETAILED DESCRIPTION OF PREFERRED EMBODIMENTS

Figure 1:
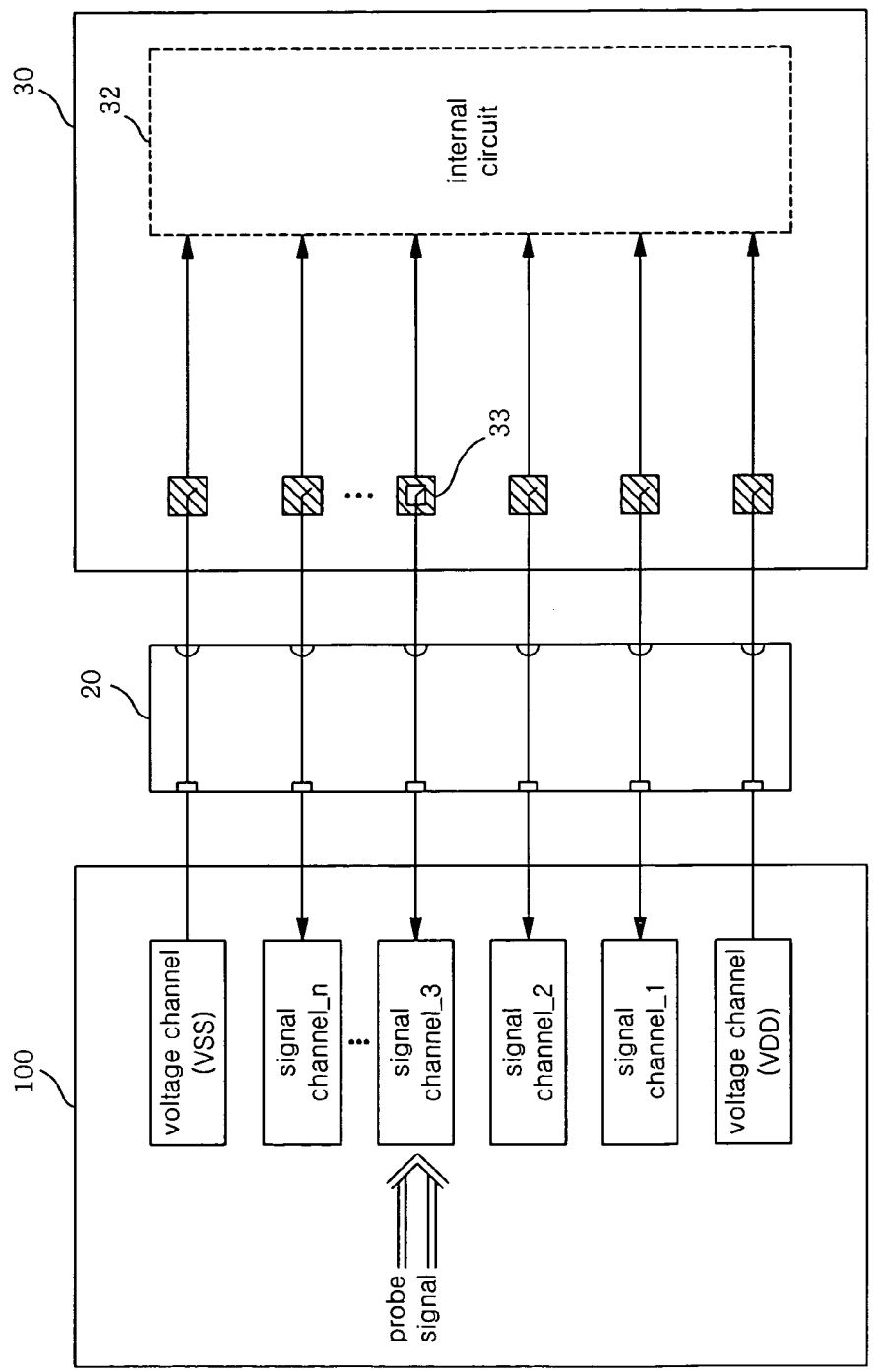
FIG. 1 is a diagram illustrating a conventional method of verifying the alignment of needles within a semiconductor device.

Reference now should be made to the drawings, in which the same reference numerals are used throughout the different drawings to designate the same or similar components.

A needle alignment verification circuit and method for a semiconductor device are described in detail below through descriptions of preferred embodiments of the present invention with reference to the accompanying drawings.

Figure 2:
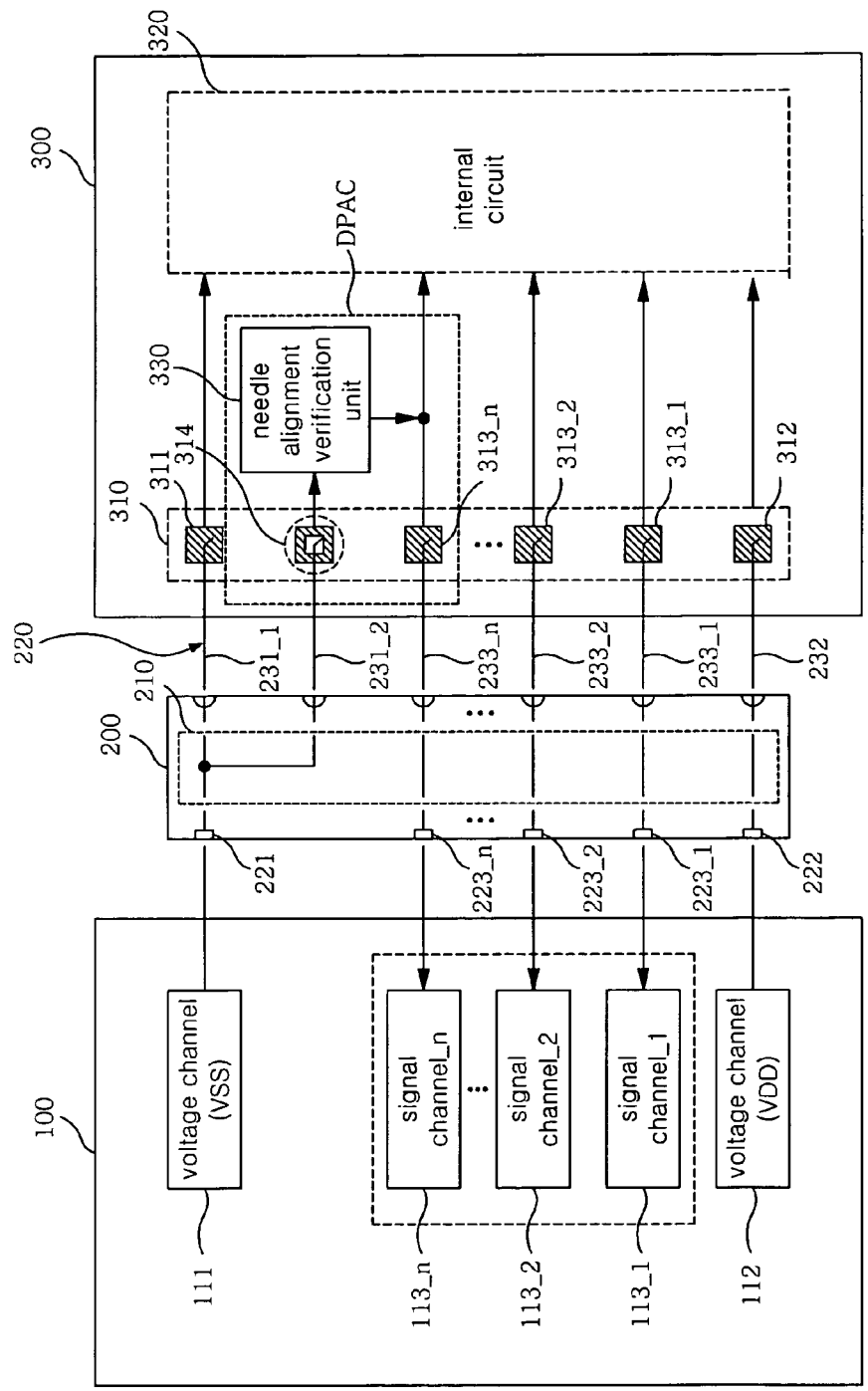
FIG. 2 is a diagram illustrating a test for verifying the alignment of needles within a semiconductor device to which a needle alignment verification circuit according to an embodiment of the present invention is applied.

FIG. 2 is a diagram illustrating a test for verifying the alignment of needles within a semiconductor device to which a needle alignment verification circuit is applied according to an embodiment of the present invention.

In the understanding of FIG. 2, it should be noted that a ground voltage VSS is used as a probe signal. The probe signal is applied to a sensor pad so as to detect the alignment between needles and the pads of a semiconductor device, e.g., whether the alignment is abnormal.

In FIG. 2, a tester 100 generates predetermined test signals, and a probe card 200 connects the tester 100 to a semiconductor device 300.

The tester 100 provides a plurality of test signals, a power voltage VDD and the ground voltage VSS. The plurality of test signals, the power voltage VDD and the ground voltage VSS provided by the tester 100 are applied to the semiconductor device 300 through the probe card 200. The test signals and the voltages VDD and VSS are provided to the probe card 200 through corresponding channels 111, 112, and 113_1 to 113_n. The tester 100 is designed such that a single signal or voltage occupies a single channel.

A separate probe signal is not needed, and the voltage provided by the tester 300 is used as the probe signal. Preferably, the probe signal used in the needle alignment verification circuit 330 of the present invention is the ground voltage VSS. That is, the ground voltage VSS functions as the probe signal that is provided to detect abnormal alignment between the needles 220 and the pads 310 of the semiconductor device. A needle alignment verification circuit according to an embodiment of the present invention does not need a separate channel for verifying needle alignment.

The probe card 200 electrically connects the tester 100 to the semiconductor device 300 in which the needle alignment verification circuit DPAC of the present invention is included. The probe card 200 includes an internal line unit 210, a plurality of channel connections 221, 222, and 223_1 to 223_n, and a plurality of needles 220 inclusive of 231_1, 231_2, 232, and 233_1 to 233_n.

In an internal line unit 210 of the probe card 200, an internal line connected to a ground voltage channel 111 of the tester 100, as shown in FIG. 2, branches into two or more internal lines 231_1 and 232_2. The internal line 231_1 is used to apply the ground voltage VSS to the data pad 311. The internal line 231_2 transmits the ground voltage VSS as a probe signal to the needle alignment verification circuit DPAC through the sensor pad 314 of the semiconductor device 300.

FIG. 2 illustrates an example in which the internal line of the probe card 200 for transmitting the ground voltage VSS branches into two lines. However, it will be apparent to those skilled in the art that the internal line of the probe card 200 for transmitting the ground voltage VSS can branch into three or more lines.

The semiconductor device 300 includes a pad unit 310 and a needle alignment verification unit 330. The pad unit 310 includes a plurality of data pads 311, 312, and 313_1 to 313_n and a sensor pad 314 for providing and/or receiving respective signals and voltages. The plurality of data pads 311, 312, and 313_1 to 313_n and the sensor pad 314 are regularly arranged at predetermined locations within the semiconductor device 300.

The needle alignment verification circuit DPAC according to an embodiment of the present invention is formed of the data pad 313_n, the sensor pad 314 and the needle alignment verification unit 330.

Figure 3:
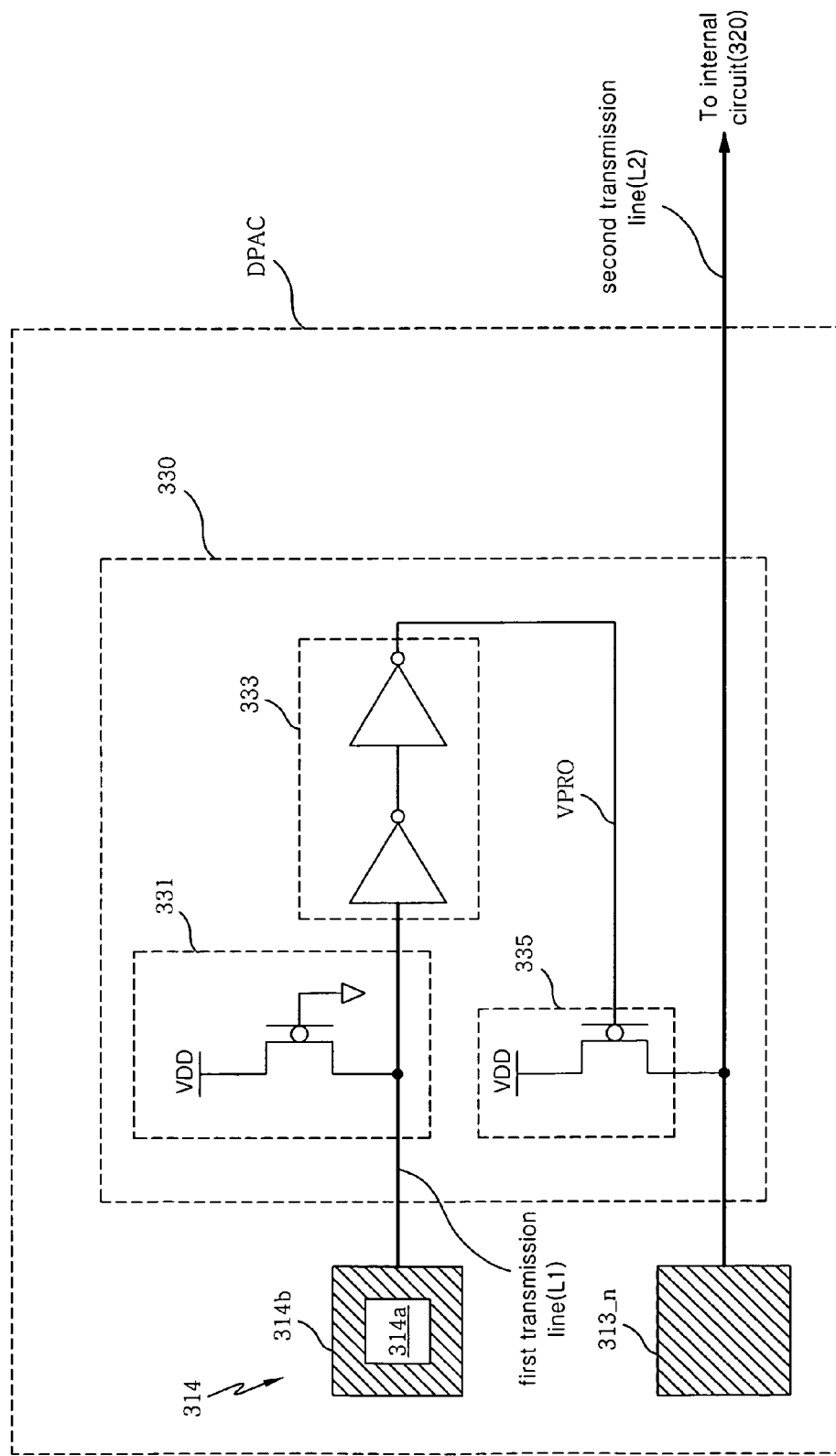
FIG. 3 is a diagram illustrating a needle alignment verification circuit according to an embodiment of the present invention in detail.

FIG. 3 is a diagram illustrating a needle alignment verification circuit DPAC according to an embodiment of the present invention in detail. The needle alignment verification circuit DPAC includes the data pad 313_n, the sensor pad 314 and the needle alignment verification unit 330.

The sensor pad 314 receives a probe signal provided through the voltage channel 111 of the tester 200.

Figure 4:
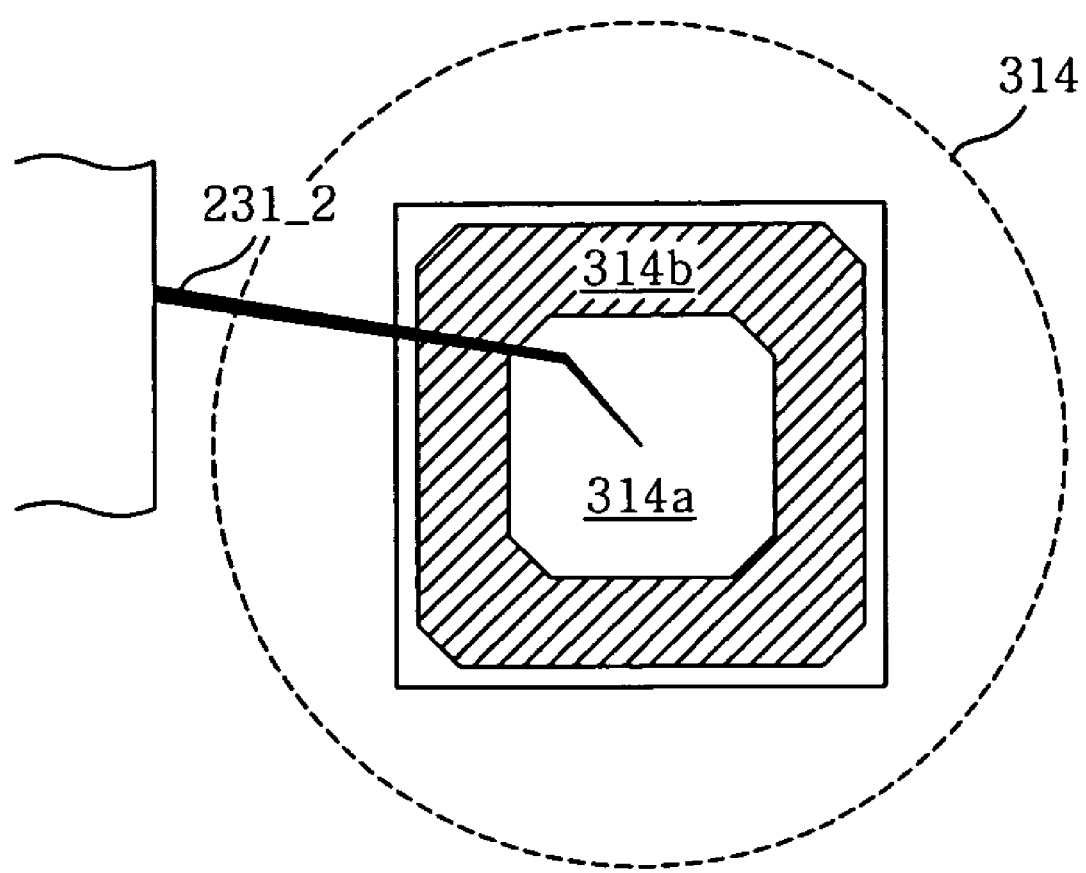
FIG. 4 is a diagram illustrating the plan view structure of the sensor pad of FIG. 2.

The sensor pad 314 includes an insulation part 314a and a conduction part 314b. Preferably, as shown in FIG. 4, the insulation part 314a is placed on a central portion of an upper surface of the sensor pad 314, and the conduction part 314b is placed on an outer portion of the sensor pad 314. The insulation part 314a is formed of an insulating material, and the conduction part 314b is made of a conductive material. For example, the insulation part 314a may be made of oxide, which has high contact resistance, and the conduction part 314b may be made of conductive, metallic material, such as tungsten or aluminum.

The needle alignment verification unit 330 generates a proving result signal VPRO. The proving result signal VPRO is controlled so that it has a logic 'L' state in response to the application of the probe signal to the conduction part 314b of the sensor pad 314, which indicates that the needle is not aligned with the sensor pad 314.

The needle alignment verification unit 330 includes a first transmission line L1, a control element 331, a buffer 333, a response element 335 and a second transmission line L2. The first transmission line L1 electrically connects the conduction part 314b of the sensor pad 314 with the needle alignment verification unit 330. The first transmission line L1 guides the probe signal, which is provided from the conduction part 314b of the sensor pad 314, to the interior of the semiconductor device 300.

The control element 331 controls the first transmission line L1 so that it has a logic 'H' state. Based on the probe voltage VSS transmitted from the tester 100, the logic state of the first transmission line L1 may transition to logic 'L'. A logic 'H' state may be defined as a 'first logic state', whereas a logic 'L' state is defined as a 'second logic state'. Preferably, the control element 331 may be composed of a PMOS transistor.

Accordingly, when a needle 220 comes into contact with the insulation part 314a of the sensor pad 314, the first transmission line L1 is maintained in the state of power voltage VDD by the control element 331. That is, the first transmission line L1 is maintained in the logic 'H' state.

When the needle 220 comes into contact with the conduction part 314b of the sensor pad 314, the first transmission line L1 is controlled by the ground voltage VSS applied to the conduction part 314b so that it is at ground voltage VSS. That is, the logic state of the first transmission line L1 changes from logic 'H' to logic 'L'.

The second transmission line L2 is connected to the data pad 313_n, and enables the transmission of signals to the data pad 313_n.

The response element 335 provides a predetermined proving result voltage to the second transmission line L2. The response element 335 controls the second transmission line L2 so that the second transmission line L2 has the state of power voltage VDD, that is, the logic 'H' state, in response to the logic 'L' state of the first transmission line L1. Preferably, the response element 335 is composed of a PMOS transistor.

When the first transmission line L1 has a logic 'H' state, the response element 335 has a turned-off state. Accordingly, the pre-charged state of the second transmission line L2 is detected.

An NMOS transistor (not shown) may be included to pre-charge the second transmission line L2. Where such an NMOS transistor is implemented, the second transmission line L2 is pre-charged to the ground voltage VSS. At the data pad 313_n, the state of the ground voltage VSS of the second transmission line L2 is detected.

When the first transmission line L1 has a logic 'L' state, the response element 335 is turned on and the second transmission line L2 has the state of power voltage VDD. At the data pad 313_n, the state of the power voltage VDD of the second transmission line L2 is detected.

When the needle 231_2 is aligned with the sensor pad 314, the second transmission line L2 has a pre-charge state. When the needle 231_2 is not aligned with the sensor pad 314, the second transmission line L2 has the state of power voltage VDD.

The data pad 313_n receives a signal from the second transmission line L2 at a verification result voltage when the needle is not aligned with the sensor pad 314, that is, the state of the power voltage VDD, and provides the signal to the tester 100 through the probe card 200.

The buffer 333 of FIG. 3 buffers the signal of the first transmission line L1 and controls the response element 335.

In the internal circuit 320, a cell array and a peripheral circuit may be implemented. The construction and operation of the internal circuit 320 are not related to the present invention and detailed descriptions thereof are omitted in the present invention.

Figure 5:
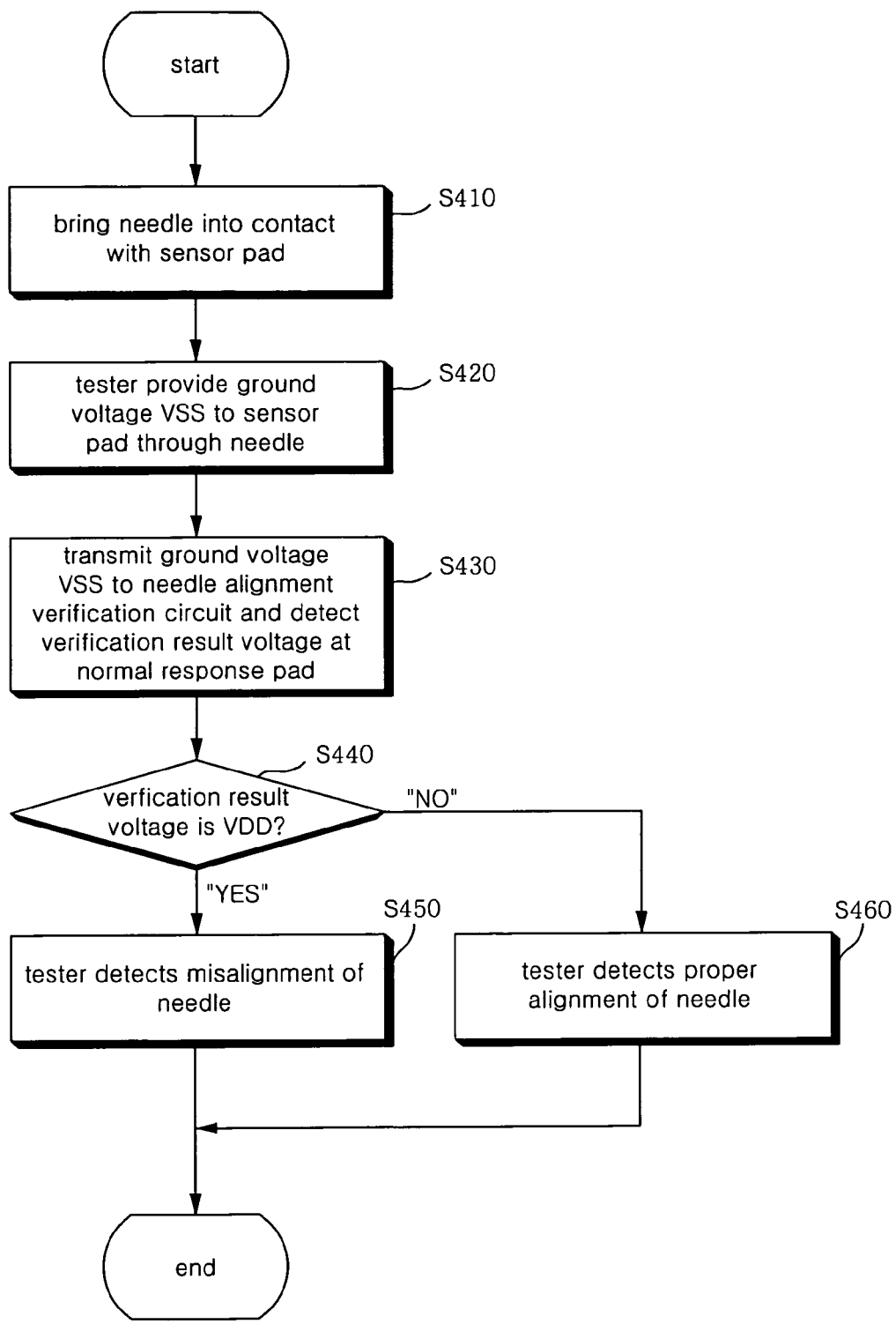
FIG. 5 is a flowchart illustrating a needle alignment verification method according to an embodiment of the present invention.

FIG. 5 is a flowchart illustrating a needle alignment verification method according to an embodiment of the present invention. With reference to FIG. 5, the needle alignment verification method of the present invention is described below.

At block S410, the probe card 200 and the tester 100 are electrically connected to each other, and the needle of the probe card 200 comes into electrical contact with the sensor pad 314 of the semiconductor device 300. At block S420, the tester 100 applies the ground voltage VSS as the probe voltage to the sensor pad 314 through the needle of the probe card 200.

At block S430, the ground voltage VSS applied to the sensor pad 314 is applied to the needle alignment verification circuit DPAC, and the voltage state of the second transmission line L2 is detected at the data pad 313_n. At block S440, the tester 100 determines whether the state of the verification result voltage detected at the data pad 313_n is that of the power voltage VDD.

If the state of the verification result voltage is that of the power voltage VDD, the tester 100 detects the misalignment of the needle at block S450. Upon detecting the misalignment, a measurer relocates the semiconductor device 300. If the state of the verification result voltage is not that of the power voltage VDD but is, for example, that of the ground voltage VSS, the tester 100 detects the proper alignment of the needle at block S460.

The above-described needle alignment verification circuit DPAC for a semiconductor device according to an embodiment of the present invention uses voltage applied by the tester 100, for example, the ground voltage VSS as the probe signal. The probe signal is provided through a voltage channel that can be extended in a probe card, etc.

Accordingly, semiconductor devices to which a needle alignment verification circuit DPAC according to an embodiment of the present invention is applied can detect misalignment between a needle and the pad of the semiconductor device without the consumption of an additional signal channel.

Although the present invention has been described with reference to embodiments illustrated in the drawings, and those skilled in the art can understand that various modifications and other equivalent embodiments can be achieved from the description.

For example, in the present specification, an embodiment in which the ground voltage VSS is used as the probe voltage has been illustrated and described. However, it will be apparent to those skilled in the art that the technical spirit of the present invention can be realized by another embodiment in which the power voltage VDD is used as the probe voltage and the construction of the control element, buffer and response element of the needle alignment proving unit 330 is modified.

What is claimed is:

1. A needle alignment verification circuit for a semiconductor device, comprising:
    a sensor pad for receiving a probe signal provided through a voltage channel of a tester, the sensor pad comprising an insulation part made of insulating material and a conduction part made of conductive material;
    a first transmission line electrically connected to the conduction part of the sensor pad and to an interior of the semiconductor device;
    a control element for asserting the first transmission line at a first logic state, and upon receiving the probe signal at the conductor part, transitioning to a second logic state;
    a data pad;
    a second transmission line for providing a predetermined signal to the data pad; and
    a response element for controlling the second transmission line so that the second transmission line has a state of a verification result voltage for a misalignment state in response to the second logic state of the first transmission line.

2. The needle alignment verification circuit as set forth in claim 1, wherein:
    the insulation part is disposed on a central portion of an upper surface of the sensor pad; and
    the conduction part is disposed on an outer portion of the upper surface of the sensor pad.

3. The needle alignment verification circuit as set forth in claim 1, wherein:
    the probe signal is ground voltage; and
    the control element comprises a PMOS transistor for supplying a power voltage to the first transmission line.

4. The needle alignment verification circuit as set forth in claim 1, wherein the response element comprises a PMOS transistor that is gated in response to a signal of the first transmission line having the second logic state.

5. The needle alignment verification circuit as set forth in claim 1, further comprising a buffer for buffering a signal of the first transmission line and controlling the response element.

6. A needle alignment verification circuit for a semiconductor device, comprising:
    a sensor pad for receiving a probe signal provided through a voltage channel of a tester, the sensor pad comprising an insulation part made of insulating material and a conduction part made of conductive material;
    a needle alignment verification unit for generating a predetermined verification result signal for a misalignment state in response to an application of the probe signal to the conduction part of the sensor pad; and a data pad for receiving the verification result signal for the misalignment state transmitted from the needle alignment verification unit.

7. A needle alignment verification method for a semiconductor device, the semiconductor device having a sensor pad in which an insulation part made of an insulating material is disposed on a central portion of an upper surface thereof and a conduction part made of a conductive material is disposed on an outer portion of the upper surface thereof, the method comprising the steps of:

bringing a needle of a probe card into contact with a sensor pad;

providing a probe signal from a tester to the sensor pad through the needle of the probe card;

transmitting the probe signal, which is provided through the sensor pad, to a needle alignment verification unit, and detecting a state of a verification result voltage at a data pad;

determining whether the state of the verification result voltage is a state of power voltage; and determining a misalignment of the needle and the sensor pad if the state of the verification result voltage is the state of the power voltage.

8. The needle alignment verification method as set forth in claim 7, wherein the probe signal is a ground voltage.

9. The needle alignment verification method as set forth in claim 7, further comprising adjusting an alignment of the needle and the sensor pad until the state of the verification result voltage is other than the power voltage.

* * * * *